(12) United States Patent
Manabe et al.

(10) Patent No.: US 7,161,130 B2
(45) Date of Patent: *Jan. 9, 2007

(54) LOW VOLTAGE ACTIVE CMOS PIXEL ON AN N-TYPE SUBSTRATE WITH COMPLETE RESET

(75) Inventors: Sohei Manabe, San Jose, CA (US); Hidetoshi Nozaki, Santa Clara, CA (US)

(73) Assignee: OmniVision Technologies, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/347,857

(22) Filed: Feb. 6, 2006

(65) Prior Publication Data

US 2006/0157645 A1  Jul. 20, 2006

Related U.S. Application Data

(63) Continuation of application No. 10/772,159, filed on Feb. 4, 2004, now Pat. No. 7,022,965, which is a continuation-in-part of application No. 10/625,411, filed on Jul. 22, 2003, now Pat. No. 6,974,943.

(51) Int. Cl.
*H01L 27/00* (2006.01)

(52) U.S. Cl. .................................. 250/208.1; 250/214 R

(58) Field of Classification Search ............. 250/208.1, 250/214 R
See application file for complete search history.

(56) References Cited

U.S. PATENT DOCUMENTS

| 5,869,857 | A | 2/1999 | Chen |
| 6,064,053 | A | 5/2000 | Chi |
| 6,180,969 | B1 | 1/2001 | Yang et al. |
| 6,218,691 | B1 | 4/2001 | Chung |
| 6,320,617 | B1 | 11/2001 | Gee et al. |
| 6,690,000 | B1 | 2/2004 | Muramatsu |
| 6,762,401 | B1 * | 7/2004 | Lee .......................... 250/208.1 |

FOREIGN PATENT DOCUMENTS

| EP | 1223623 | 7/2002 |
| JP | 2000175107 | 6/2000 |
| JP | 2003234496 | 8/2003 |

* cited by examiner

*Primary Examiner*—Que T. Le
(74) *Attorney, Agent, or Firm*—Perkins Coie LLP

(57) ABSTRACT

A pixel sensor cell used in a CMOS image sensor is disclosed. The cell includes a pinned photodiode formed in a Pwell that is formed in an N-type semiconductor substrate. A transfer transistor is placed between the pinned photodiode and an output node. A reset transistor is coupled between a high voltage rail $V_{dd}$ and the output node. Finally, an output transistor with its gate coupled to the output node is provided.

4 Claims, 3 Drawing Sheets

LOW VOLTAGE ACTIVE CMOS PIXEL ON AN N-TYPE SUBSTRATE WITH COMPLETE RESET

CROSS-REFERENCE TO RELATED APPLICATION(S)

This application is a continuation of U.S. patent application Ser. No. 10/772,159 filed Feb. 4, 2004 now U.S. Pat. No. 7,022,965, which is a continuation-in-part of U.S. patent application Ser. No. 10/625,411 filed Jul. 22, 2003, which issued on Dec. 13, 2005 as U.S. Pat. No. 6,974,943 to which the benefit of priority is claimed.

TECHNICAL FIELD

The present invention relates to CMOS image sensors, and more particularly, to a CMOS image sensor formed on an N-type substrate and having low leakage current and large capacitance.

BACKGROUND

Integrated circuit technology has revolutionized various fields, including computers, control systems, telecommunications, and imaging. In the field of imaging, the charge coupled device (CCD) has been made popular by its performance characteristics. Nevertheless, the solid state CCD integrated circuits needed for imaging are relatively difficult to manufacture, and therefore are expensive. In addition, because of the differing processes involved in the manufacture of the CCD integrated circuits relative to MOS. integrated circuits, the signal processing portion of the imaging sensor has typically been located on a separate integrated chip. Thus a CCD imaging device includes at least two integrated circuits: one for the CCD sensor and one for the signal processing logic.

Another class of image sensors is the CMOS active pixel sensor. As noted in U.S. Pat. No. 5,625,210 to Lee et al. ("the '210 patent"), an active pixel sensor refers to an electronic image sensor with active devices, such as transistors, that are associated with each pixel. The active pixel sensor has the advantage of being able to incorporate both signal processing and sensing circuitry within the same integrated circuit because of the CMOS manufacturing techniques.

One popular active pixel sensor structure consists of four transistors and a pinned photodiode. The pinned photodiode has gained favor for its ability to have good color response for blue light, as well as advantages in dark current density and image lag. Reduction in dark current is accomplished by "pinning" the diode surface potential to the Pwell or Psubstrate (GND) through a P+ region.

In general, it is desirable to accumulate as much charge in the photodiode as possible to increase the signal level. This is generally referred to as having a large capacitance in the pixel cell. However, with an increased signal level (resulting from more accumulated charge), this may cause image lag due to the incomplete transfer of mobile charge from the diode to the floating output node, if the junction profile is not perfectly optimized for the charge transfer. This is also referred to as incomplete reset or incomplete depletion of the N-well of the pinned photodiode. A discussion of this phenomena can be found in "Characterization of Pixel Response Time and Image Lag in CMOS Sensors" by Ramaswami et al. The non-fully depleted state of the N-well is particularly evident with low voltage operation (for example 2.5 volts or lower). Low-voltage operation is becoming more and more prevalent as integrated circuit devices shrink and gate oxides become thinner.

Therefore, it is desirable to have an active pixel using a pinned photodiode that has high charge accumulation capabilities, yet complete reset of the photodiode even with low voltage operation. Another important consideration is to have a low leakage current for the pixel.

BRIEF DESCRIPTION OF THE DRAWINGS

The foregoing aspects and many of the attendant advantages of the invention will become more readily appreciated as the same become better understood by reference to the following detailed description, when taken in conjunction with the accompanying drawings, wherein.

DETAILED DESCRIPTION

The present invention relates to a CMOS image sensor design that provides low leakage current and large capacitance. In the following description, numerous specific details are provided to provide a thorough understanding of the embodiments of the invention. One skilled in the relevant art will recognize, however, that the invention can be practiced without one or more of the specific details, or with other methods, components, etc. In other instances, well-known structures or operations are not shown or described in detail to avoid obscuring aspects of various embodiments of the invention.

Reference throughout the specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout the specification are not necessarily all referring to the same embodiment. Furthermore, the particular features, structures, or characteristics may be combined in any suitable manner in one or more embodiments.

Figure 1:
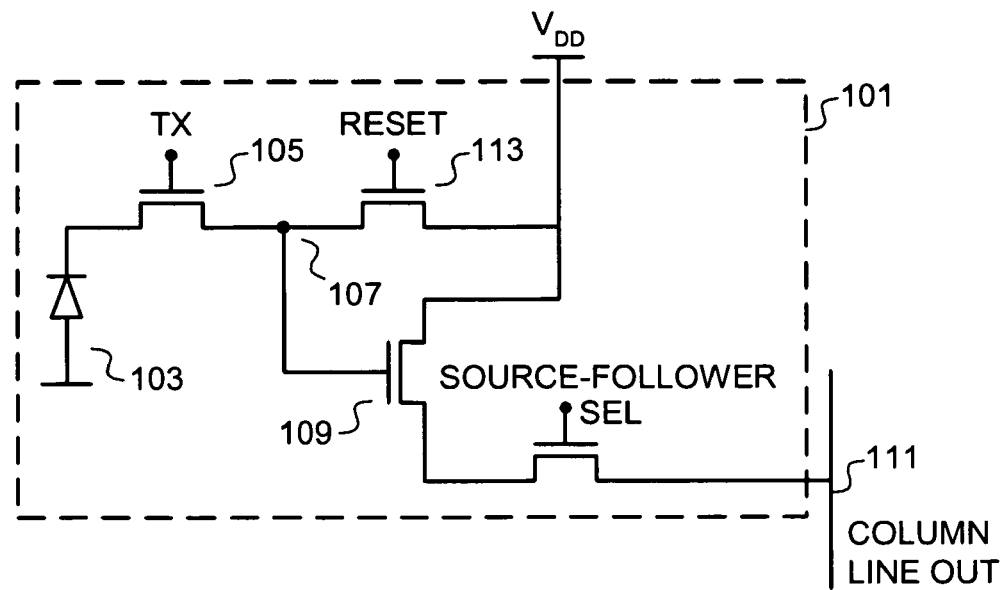
FIG. 1 is a schematic diagram of a prior art active pixel.
Figure 2:
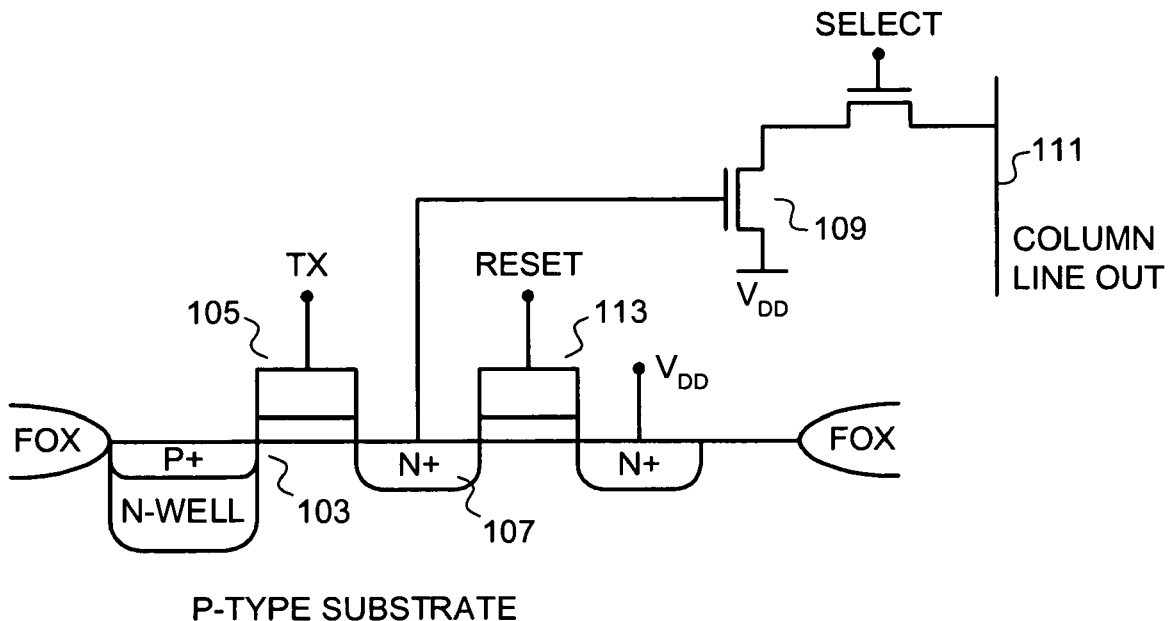
FIG. 2 is a cross section view of the prior art active pixel of FIG. 1.

FIGS. 1 and 2 show a prior art active pixel 101 with pinned photodiode 103. The pinned photodiode 103 is an N-well formed in a P-type substrate. A P+ region is formed atop of the N-well. A transfer gate (also referred to as a transfer transistor) controls the transfer of the signal from the pinned photodiode 103 to an output node 107. The output node 107 is connected to the gate of a source-follower transistor 109 (also referred to as a drive or output transistor). This results in the signal on the output node 107 being amplified and placed onto the column line out 111. A row select transistor (SEL) is used to select the particular pixel to be read out on the column line out 111. The row select transistor is controlled by a row select line. Further, a reset transistor 113 is used to deplete the signal in the pinned photodiode. Because of the particular structure of the pinned photodiode 103 shown in FIGS. 1 and 2, it is believed that all prior art pinned photodiode CMOS image sensors were formed on P-type semiconductor substrates.

The present invention modifies the prior art pinned photodiode of FIGS. 1 and 2 to allow for low-voltage operation, while having good depletion characteristics. The pinned photodiode of the present invention is formed using the standard CMOS fabrication process. In the description below, one type of dopant for the N-type implant is phosphorus, while one type of dopant for a P-type implant is boron.

In typical operation, the transfer gate 105 (for the prior art) swings from zero volts to $V_{dd}$. For image sensors that use a 5.0 volt or 3.3 volt $V_{dd}$ "rail," this results in a 5 or 3.3 volt swing. This amount of voltage swing has previously been acceptable for depleting the photodiode 103.

However, for newer integrated circuit processes, the $V_{dd}$ voltage may be 1.8 volts, 1.3 volts, or even lower. In such a situation, the voltage swing on the gate of the transfer gate is oftentimes insufficient to deplete the photodiode.

In many respects the structure of the pinned photodiode (and the CMOS image sensor) of the present invention is similar to that shown in FIGS. 1 and 2. However, in accordance with the present invention, the CMOS image sensor and pinned photodiodes are formed in an N-type semiconductor substrate.

As noted above, in order to reduce the leakage current from the silicone surface and kTC noise, the photodiode is typically provided with a P+ surface shield layer at the silicon surface and is completely depleted. This is referred to as a pinned photodiode. The voltage applied to the readout gate needs to be large enough to deplete the photodiode. However, the voltage to the readout gate is limited by the thickness of the readout gate oxide. Therefore, the positive voltage limited by the gate oxide thickness applies to the readout gate in CMOS image sensors. This relatively low voltage is too small to achieve depletion of the large photodiode capacitance. Therefore, the photodiode capacitance should be designed to be relatively small to achieve full depletion. However, an N-type photodiode with a P+ surface shield layer has a large capacitance even if a small voltage is applied to the readout gate. Further, this type of photodiode has relatively large kTC noise.

In accordance with one embodiment of the present invention, the readout gate is applied with a voltage that swings from a negative voltage to a positive voltage. This means that there is a relatively large voltage swing for the readout gate. This large voltage swing applied to the photodiode results in a large photodiode capacitance. Moreover, the leakage current from the silicon surfaces is small because holes are accumulated at the silicone surface near the readout gate.

In accordance with another aspect of the present invention, a CMOS image sensor includes pixels that are the four-transistor type with a readout circuit provided between a photodiode and a floating diffusion region. The CMOS image sensor has its pixels formed on an N-type substrate. The readout gate is controlled by a voltage that can swing from a negative voltage to a positive voltage. A negative voltage generation circuit, e.g., a negative charge pump, is formed on the same integrated circuit chip. The N-type substrate is held at either a positive voltage or at ground. Further, the readout transistor may either be an enhancement-type or a depletion-type transistor.

Figure 3:
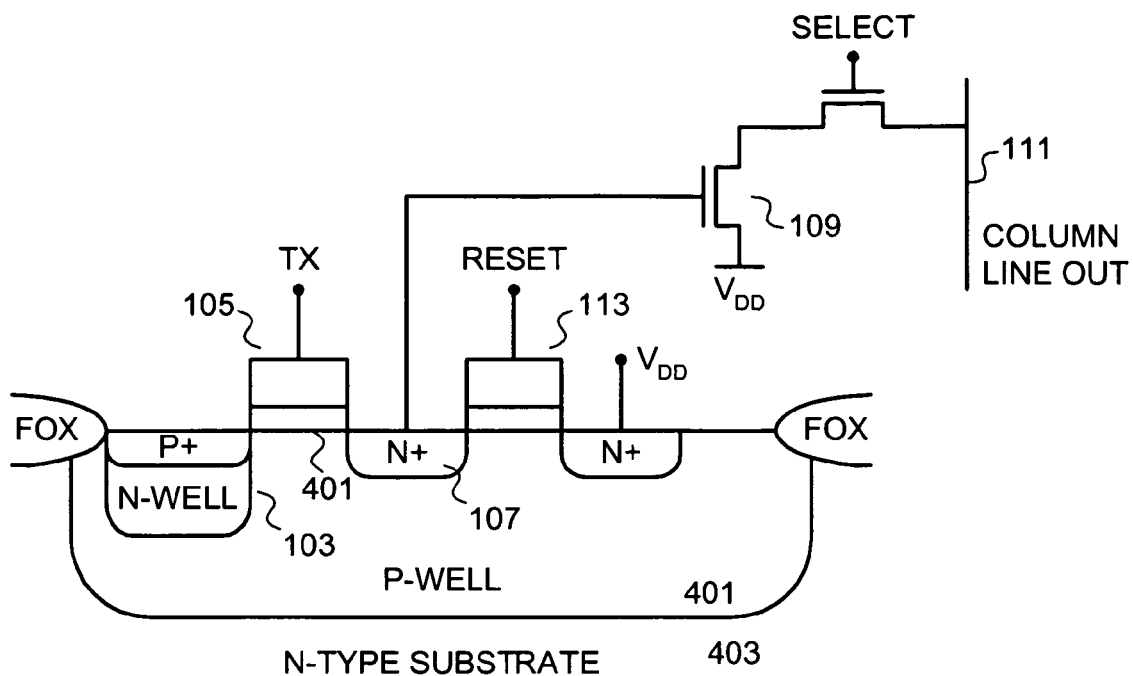
FIG. 3 is a schematic diagram of an active pixel formed in accordance with the present invention.

As seen in FIG. 3, the photodiode 103 is formed in a Pwell 401 which is formed in the N-type substrate 403. A boron concentration in the Pwell 401 may be between $0-3\times10^{17}$ atom/cm$^3$. The phosphorous concentration of the N-type substrate 403 may vary between $1\times10^{14}$ to $5\times10^{15}$ atom/cm$^3$. Note that by using an N-type wafer 403, the negative voltage required is very easy to generate and to integrate onto the same circuitry. The photodiode 103 is covered with a P+ layer to form a pinned photodiode. Further, in one embodiment, a photo shield layer covers each pixel, except for the photodiode portion. Further, in general, the channel width of the readout gate at the side of the floating diffusion region is narrower than at the side of the photodiode.

Figure 4:
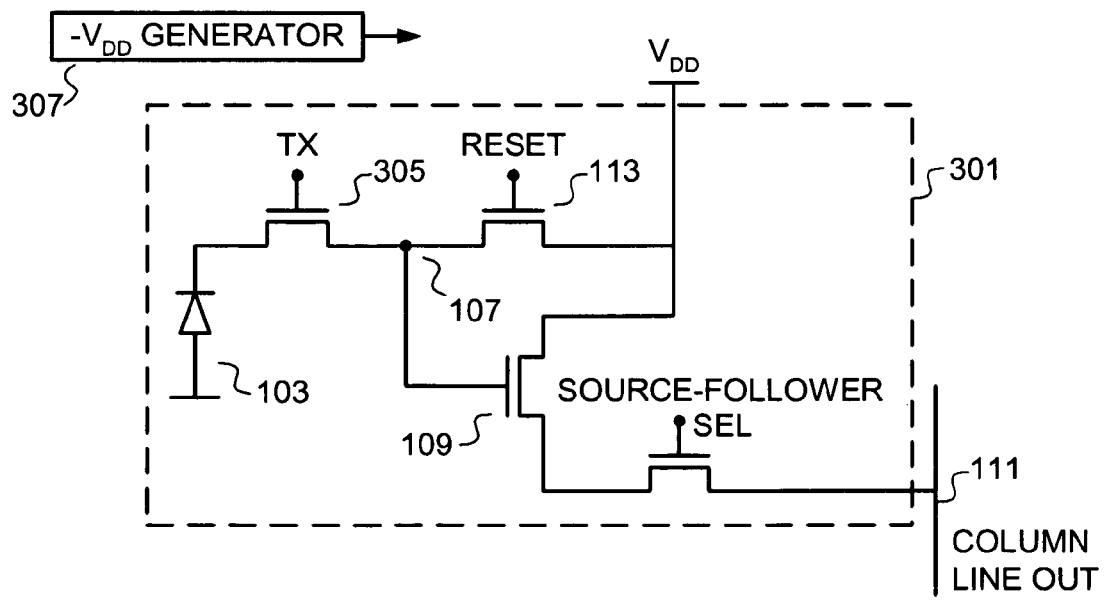
FIG. 4 is a cross section view of the active pixel of FIG. 3.

Turning to FIG. 4, a schematic diagram of an active pixel 301 formed in accordance with the present invention is shown. The active pixel 301 in many respects is similar to the one shown in FIG. 1. However, as seen, a depletion mode transfer gate 305 is used in the active pixel 301. The depletion mode transfer gate 305 (assuming an NMOS transistor) is typically formed by implanting N-type impurities underneath the gate of the depletion mode transfer gate 305. The implanted N-type impurities are shown in FIG. 3 by reference number 401.

Because of the use of the depletion mode transfer gate 305, the transfer gate is conducting even at 0 volts. Therefore, in order to operate the active pixel 301, the transfer gate 305 has its gate held at some negative voltage during the integration (light gathering) period. In one embodiment, the negative voltage is $-V_{dd}$. However, it can be appreciated that the precise magnitude of the negative voltage may vary, but the negative magnitude should be greater than the negative threshold voltage of the depletion mode transfer gate 305.

As one example, if the depletion mode transfer gate 305 has a threshold voltage of $-0.9$ volts, further with an on-chip rail of $V_{dd}$ of 1.8 volts, then the gate of the depletion mode transfer gate 305 may be held from anywhere between $-1.8$ volts and $-0.9$ volts. It is more convenient however to use the full $-V_{dd}$ voltage since it is more readily available on the integrated circuit, such as by means of a negative charge pump integrated onto the N-type substrate. Further, as will be seen in greater detail below, in some embodiments, the threshold voltage of the depletion mode transfer gate 305 is designed to be near the value of $-V_{dd}$.

Because of the need to use a negative voltage to periodically keep the depletion mode transfer gate 305 in the off state, a $-V_{dd}$ generator 307 is provided on the integrated circuit. The signal from the $-V_{dd}$ generator 307 is selectively applied to the gate of the depletion mode transfer gate 305 during the integration and reset phases of the pixel operation. The $-V_{dd}$ generator 307 is also referred to as a negative charge pump. Because of the need for a negative charge pump, the formation of a CMOS image sensor is much more easily facilitated on an N-type substrate as is taught herein.

During standard operation of the depletion mode transfer gate 305, the gate of the depletion mode transfer gate 305 can swing from $-V_{dd}$ to $V_{dd}$. This is twice the amount of voltage swing available in the prior art transfer gate of FIG. 1, which uses an enhancement mode transfer gate 105. As can be seen, the voltage swing is provided while maintaining low-voltage operation.

The relatively large voltage swing by the use of a depletion mode transfer gate 305 as compared to an enhancement mode transfer gate is advantageous. First, the large voltage swing allows for the pinned photodiode 103 to be more easily depleted during the reset stage. Second, it is believed that the use of a depletion mode transfer gate 305 allows hole accumulation to occur at the surface near the transfer gate 305, thereby reducing leakage current.

Figure 5:
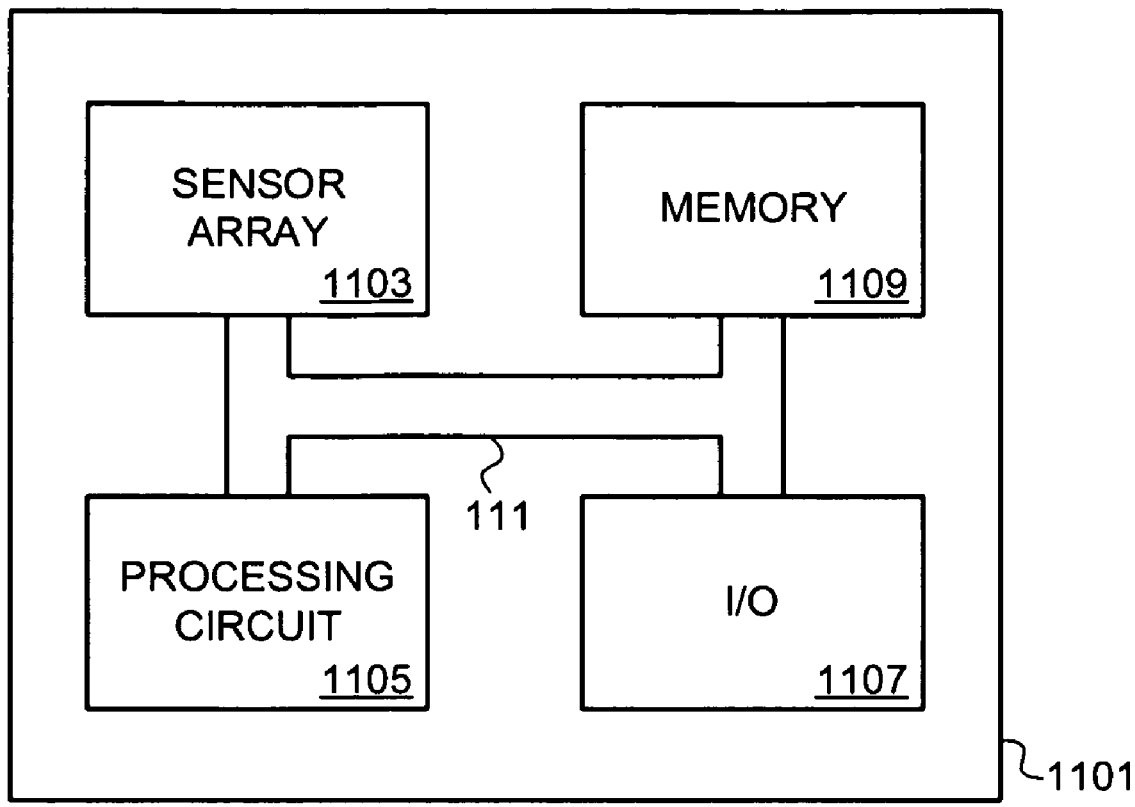
FIG. 5 is a block diagram of a CMOS image sensor formed in accordance with the present invention.

The active pixels described above may be used in a sensor array of a CMOS image sensor 1101. Specifically, FIG. 5 shows a CMOS image sensor formed in accordance with the present invention. The CMOS image sensor includes a sensor array 1103, a processor circuit 1105, an input/output (I/O) 1107, memory 1109, and bus 1111. Preferably, each of these components is formed on a single N-type semiconductor silicon substrate and manufactured to be integrated onto a single chip using standard CMOS processes.

The sensor array 1103 portion may be, for example, substantially similar to the sensor arrays portions of image sensors manufactured by the assignee of the present invention, OmniVision Technologies, Inc., of Sunnyvale, Calif., as model numbers OV7630, OV7920, OV7930, OV9620, OV9630, OV6910, or OV7640, except that the pixels are replaced with the active pixels disclosed herein. Further, unlike these prior art image sensors, the CMOS image sensor of the present invention is formed on an N-type semiconductor substrate.

More specifically, the sensor array 1103 includes a plurality of individual pixels arranged in a two-dimensional array. In operation, as an image is focused onto the sensor array 1103, the sensor array 1103 can obtain the raw image data.

The raw image data is then received by the processor circuit 1105 via bus 1111 to begin signal processing. The processor circuit 1105 is capable of executing a set of preprogrammed instructions (perhaps stored in memory 1107) necessary to carry out the functions of the integrated circuit 1101. The processor circuit 1105 may be a conventional microprocessor, DSP, FPGA or a neuron circuit.

While the preferred embodiment of the invention has been illustrated and described, it will be appreciated that various changed can be made therein without departing from the spirit and scope of the invention.

Also, rather than being implemented in a four transistor active pixel sensor, other designs of active pixel sensors could be used, such as a two transistor, a four transistor, or a log scale implementation. As previously noted, some examples of general prior art design approaches to these other styles are shown in U.S. Pat. Nos. 5,587,596; 5,926,214; and 5,933,190.

The present invention has thus been described in relation to a preferred and several alternate embodiments. One of ordinary skill after reading the foregoing specification will be able to affect various changes, alterations, and substitutions of equivalents without departing from the broad concepts disclosed. It is therefore intended that the scope of the letters patent granted hereon be limited only by the definitions contained in appended claims and equivalents thereof, and not by limitations of the embodiments described herein.

We claim:

1. A pixel sensor cell comprising:
   a photodetector formed in an N-type semiconductor substrate;
   a depletion mode transfer transistor placed between the photodetector and an output node;
   a reset transistor coupled between a high voltage rail $V_{dd}$ and the output node; and
   an output transistor, the gate of the output transistor being coupled to the output node.

2. The pixel sensor cell of claim 1, wherein the output node is the source of the transfer transistor and said photodetector is the drain of said transfer transistor.

3. The pixel sensor cell of claim 2, further including a negative voltage generator that generates a negative voltage sufficient to turn off said depletion mode transfer transistor.

4. The pixel sensor cell of claim 1 wherein said photodetector is selected from the group of a photodiode, a pinned photodiode, a partially pinned photodiode, or a photogate.

* * * * *